United States Patent
Haas et al.

(10) Patent No.: US 8,711,334 B2
(45) Date of Patent: Apr. 29, 2014

(54) LIGHT BARRIER AND METHOD FOR DETECTING OBJECTS

(75) Inventors: Heinz Haas, Regensburg (DE); Wojciech Giziewicz, Heilbronn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 211 days.

(21) Appl. No.: 13/000,333

(22) PCT Filed: Jun. 18, 2009

(86) PCT No.: PCT/DE2009/000864
§ 371 (c)(1),
(2), (4) Date: Mar. 22, 2011

(87) PCT Pub. No.: WO2009/152820
PCT Pub. Date: Dec. 23, 2009

(65) Prior Publication Data
US 2011/0188025 A1    Aug. 4, 2011

(30) Foreign Application Priority Data

Jun. 20, 2008  (DE) .................. 10 2008 029 467

(51) Int. Cl.
*G01C 3/08* (2006.01)
(52) U.S. Cl.
USPC ............... 356/4.07; 257/E33.067; 257/80
(58) Field of Classification Search
USPC ........ 356/28, 28.5, 4.01, 5.01, 614, 622, 4.07
See application file for complete search history.

(56) References Cited

U.S. PATENT DOCUMENTS

| | | | | |
|---|---|---|---|---|
| 3,892,492 | A | * | 7/1975 | Eichenberger ............... 356/434 |
| 5,670,781 | A | * | 9/1997 | Setbacken ................ 250/231.16 |
| 6,023,335 | A | * | 2/2000 | Wustefeld ..................... 356/388 |
| 6,355,937 | B2 | | 3/2002 | Antonelli et al. |
| 6,486,467 | B1 | * | 11/2002 | Speckbacher et al. ..... 250/237 G |
| 6,528,779 | B1 | * | 3/2003 | Franz et al. ................ 250/214.1 |
| 6,781,705 | B2 | * | 8/2004 | Waslowski et al. .......... 356/614 |
| 6,838,684 | B2 | | 1/2005 | Bakker et al. |
| 7,285,771 | B2 | | 10/2007 | Walker |
| 7,439,549 | B2 | * | 10/2008 | Marchl et al. .................. 257/88 |
| 7,504,611 | B2 | * | 3/2009 | Tsuji .............................. 250/206 |
| 8,210,337 | B2 | * | 7/2012 | Zwieg et al. .................. 194/334 |
| 2006/0133655 | A1 | | 6/2006 | Cheng et al. |
| 2006/0219876 | A1 | * | 10/2006 | Halter ......................... 250/222.1 |
| 2007/0090282 | A1 | | 4/2007 | Chin et al. |

(Continued)

FOREIGN PATENT DOCUMENTS

| | | | |
|---|---|---|---|
| CN | 1495531 | 5/2004 | |
| CN | 101008679 | * 1/2007 | ............... A63F 7/02 |

(Continued)

*Primary Examiner* — Luke Ratcliffe
*Assistant Examiner* — Assres H Woldemaryam
(74) *Attorney, Agent, or Firm* — Cozen O'Connor (57) ABSTRACT

A light barrier comprising a semiconductor component (1) and to a method for detecting objects with a carrier (2), a semiconductor chip (4) which detects an electromagnetic radiation, a semiconductor chip (4) which emits an electromagnetic radiation, and a direction-selective element (5, 8), which delimits an angle range of the radiation which can be received by the detecting semiconductor chip (4) and/or of the radiation to be emitted by the emitting semiconductor chip (3), wherein a main radiation axis (V) of the radiation which can be received is tilted relative to a main radiation axis (U) of the radiation to be emitted.

18 Claims, 7 Drawing Sheets

(56) References Cited

U.S. PATENT DOCUMENTS

| | | | |
|---|---|---|---|
| 2007/0170380 A1* | 7/2007 | Tsuji | 250/559.32 |
| 2008/0316505 A1* | 12/2008 | Graf et al. | 356/614 |
| 2009/0115993 A1* | 5/2009 | Doemens et al. | 356/5.01 |

FOREIGN PATENT DOCUMENTS

| | | | |
|---|---|---|---|
| DE | 196 44 565 | | 4/1998 |
| DE | 19644565 | * | 4/1998 ............. B60R 21/01 |
| DE | 199 12 720 | | 10/1999 |
| DE | 198 29 513 | | 1/2000 |
| DE | 102 01 746 | | 8/2002 |
| DE | 10 2006 011 191 | | 10/2006 |
| EP | 0 499 945 | | 8/1992 |
| EP | 1 722 191 | | 11/2006 |
| JP | 56-034354 | | 8/1979 |
| JP | 56-092638 | | 12/1979 |
| JP | 01-156694 | | 6/1989 |
| JP | 01-171053 | | 12/1989 |
| JP | 08-159871 | | 6/1996 |
| JP | 2001-024213 | | 1/2001 |
| JP | 2001-250979 | | 9/2001 |
| JP | 2002-094127 | | 3/2002 |
| JP | 2002-168967 | | 6/2002 |
| JP | 2003-069533 | | 3/2003 |
| JP | 2004-355867 | | 12/2004 |
| JP | 2006-32566 | | 2/2006 |
| JP | 2007-157791 | | 6/2007 |
| JP | 2007-201170 | | 8/2007 |
| JP | 2009-518634 | | 5/2009 |

* cited by examiner

LIGHT BARRIER AND METHOD FOR DETECTING OBJECTS

RELATED APPLICATIONS

This is a U.S. national stage of application No. PCT/EP2009/000864, filed on Jun. 18, 2009.

This application claims the priority of German application no. 10 2008 029 467.5 filed Jun. 20, 2008, the entire content of which is hereby incorporated by reference.

FIELD OF THE INVENTION

The invention relates to a light barrier and to a method for detecting objects with a carrier, a semiconductor chip which detects an electromagnetic radiation, and a direction-selective element arranged and specially shaped and/or positioned alongside or above the detecting semiconductor chip.

BACKGROUND OF THE INVENTION

A large number of possibilities are known for detecting objects in a region or zone to be examined. One possibility for detecting objects is the use of light barriers. The term light barrier is understood hereinafter likewise to include the terms proximity sensor and motion sensor. A light barrier is an electronic-optical system comprising at least one emitter and at least one detector. A semiconductor chip which emits an electromagnetic radiation is considered to be an emitter. The emitter is also referred to as transmitter or radiation source. The detector, by contrast, is a semiconductor chip which detects an electromagnetic radiation, and which is also referred to as sensor or receiver.

The functional principle of a light barrier will be explained briefly below. The emitter emits an electromagnetic radiation in a specific wavelength range with a corresponding light intensity I. The detector is sensitive at least to this specific wavelength range of the radiation. The beam path between emitter and detector is altered by an object to be detected in the light barrier. The resultant alteration of the impinging luminance of the radiation is registered in the detector. This registration is converted into an electrical switching signal in a subsequent step, said signal then being processed further.

The luminance L is defined as the ratio of the emitted light intensity I to the size A of its apparent luminous area. Luminance has the SI unit candela cd per square meter $m^2$. Luminance is the photometric equivalent to radiance $L(\lambda)$ having the unit watt*$meter^{-2}$*$steradian^{-1}$ or $W \cdot m^{-2} \cdot sr^{-1}$ in radiometry.

In the case of light barriers, a distinction is made, in principle, between one-way light barriers and reflected light barriers. In the case of one-way light barriers, emitter and detector are opposite one another, wherein the main emission direction of the emitter lies directly in the direction of the detector. Accordingly, the detector constantly detects the luminance caused by the emitter. As soon as an object enters the beam path between emitter and detector, the beam path is interrupted. The resultant non-detection of the emitted radiation of the emitter is evaluated in a further-processing unit.

In the case of reflected light barriers, in contrast to the one-way light barrier, emitter and detector are not opposite one another and are furthermore preferably situated in a common housing. As a result, the construction is less complex. In principle, in the case of reflected light barriers, a distinction is made 30, between two methods for detecting objects.

In the case of the first method, a reflective element is arranged on a first side, and the housing with emitter and detector is arranged on an opposite side. The element and the housing are oriented in such a way that an interruption of the beam path by an object causes a change in luminance in the detector.

Alternatively, no reflector is used. If an object is in the beam path of the emitter, then the radiation of the emitter impinges on the object and is scattered at the object surface on account of the surface configuration of the object. As a result of the scattering, part of the emitted radiation will impinge on the detector. The change in the luminance in the detector is registered.

A general problem in the configuration of light barriers is the influence of environmental variables, for example daylight, extraneous light or the like.

Detector and emitter are increasingly being accommodated on a carrier within a housing. Electrical driving arrangements can thereby be configured in a simplified manner. As a result, it is necessary to take account of a further problem in the configuration of light barriers, so-called crosstalk between the emitting semiconductor chip and the detecting semiconductor chip. This crosstalk occurs if, for example, radiation is coupled into the detector on a direct path from the emitter before said radiation has left the housing. Crosstalk likewise occurs if the radiation is reflected within the housing and impinges on the detector. The radiation which reaches the detector as a result of crosstalk changes the operating point on the characteristic curve of the detector. The sensitivity of the detector is sometimes greatly impaired by the change in operating point. In order to increase the sensitivity of a light barrier, it should always be endeavored to minimize the environmental influences and the crosstalk.

SUMMARY OF THE INVENTION

It is an object of the invention to provide a light barrier and also a method for detecting objects wherein the sensitivity for detecting objects is increased.

This object is achieved by means of the measures specified in the coordinate patent claims. Further advantageous configurations are presented in the dependent claims.

In accordance with at least one embodiment of the light barrier, the latter comprises a semiconductor component. The semiconductor component comprises a carrier having a carrier top side. At least one semiconductor chip which detects electromagnetic radiation and at least one semiconductor chip which emits electromagnetic radiation are fitted to the carrier top side. The semiconductor chips are designed, in particular, for detecting and, respectively, for emitting visible or, preferably, near infrared radiation.

In accordance with at least one embodiment of the light barrier, the latter has at least one direction-selective element at the top side of the carrier. The direction-selective element is assigned, in particular, to at least one of the detecting and/or of the radiation-emitting semiconductor chips. The direction-selective element is used to delimit an angle range of a radiation to be received by the semiconductor chip and/or of a radiation to be emitted by the semiconductor chip. In other words, an emission characteristic of the radiation-emitting semiconductor chip is delimited or set by the direction-selective element for example in such a way that no or substantially no radiation generated by the emitting semiconductor chip penetrates into specific solid angle ranges. With regard to the detecting semiconductor chip, delimited means that no or substantially no radiation from a specific angle range can reach the detecting semiconductor chip. That is to say that the direction-selective element is used to delimit an angle from which radiation can be detected, that is to say can be received by the semiconductor component and/or into which radiation can be emitted by the semiconductor component.

In accordance with at least one embodiment of the light barrier, at least one main radiation axis of the radiation which can be received is tilted relative to at least one main radiation axis of the radiation to be emitted. The main radiation axis is, for example, an axis of symmetry, or an optical axis of the radiation to be emitted or to be received by the semiconductor chips, or else a direction in which an intensity maximum of the radiation proceeds.

This can mean that the direction-selective element assigned to the radiation-emitting semiconductor chip, for example, delimits or predefines an emission characteristic of said semiconductor chip in such a way that the optical axis, the direction in which the intensity maximum of the radiation is emitted and/or the axis of symmetry of the emitted radiation is not oriented parallel to the corresponding main radiation axis of the radiation to be received. To put it another way, an optical axis of the radiation-emitting semiconductor chip and/or of the radiation-detecting semiconductor chip preferably does not correspond to a mechanical axis and/or optical axis and/or axis of symmetry of the direction-selective element assigned to the semiconductor chip. With regard to the detecting semiconductor chip, the main radiation axis can also be a direction as seen from which most of the radiation can impinge on the semiconductor chip or on a radiation-sensitive area of the semiconductor chip.

In order to determine the respective main radiation axes, therefore, it is necessary to take account of both an emission characteristic or reception characteristic of the respective emitting or detecting semiconductor chip and the change in said emission characteristic or reception characteristic by means of the direction-selective element assigned, if appropriate, to the semiconductor chip.

In accordance with at least one embodiment of the light barrier, an angle between the main radiation axes of the detecting semiconductor chip and of the emitted semiconductor chip, taking account of the, if appropriate, associated direction-selective element, is between 5° and 65° inclusive, in particular between 15° and 45° inclusive, preferably between 20° and 40° inclusive.

In accordance with at least one embodiment of the light barrier, the direction-selective element is formed by a diaphragm, by a converging lens, by a diverging lens, by a Fresnel lens, by a prism and/or by a reflector.

In accordance with at least one embodiment of the light barrier a semiconductor component comprising a carrier, at least one semiconductor chip which is applied on a top side of the carrier and detects an electromagnetic radiation, and a barrier or diaphragm applied at or on the top side of the carrier alongside the detecting semiconductor chip is provided, wherein the barrier or diaphragm consists of a material non-transmissive to the electromagnetic radiation to be detected, is spaced apart from the detecting semiconductor chip and is shaped in such a way that, in the event of parallel projection of the barrier and of the detecting semiconductor chip perpendicularly onto the top side of the carrier, the projected area of the barrier and the projected area of the detecting semiconductor chip at least partly overlap.

By virtue of the specified configuration of the semiconductor component of the light barrier, firstly the region in which a detector can detect an object is restricted in a limited fashion. This restriction additionally reduces the luminance that impinges on the detector as a result of environmental influences, for example daylight, extraneous illumination or the like. Restricting the region to be detected minimizes the influence of these environmental variables for the detection of objects and thereby stabilizes the operating point of the detector. The same also correspondingly holds true if the direction-selective element is shaped as a diaphragm, lens or reflector.

In a further configuration, the semiconductor component of the light barrier furthermore has a semiconductor chip which emits an electromagnetic radiation, wherein the barrier is arranged between detector and emitter. In this way, crosstalk of the emitted radiation onto the detecting semiconductor chip is additionally minimized. This partial overlapping of the projected areas ensures that so-called crosstalk, for example caused by the housing constitution of the semiconductor component, does not impinge on the detector. As a result, the so-called inherent noise of the detector is reduced, the optimum operating point of the detector is maintained and a higher sensitivity is obtained.

In one configuration, the direction-selective element, in particular the barrier, is applied on the top side of the carrier by means of an adhesive. Said adhesive is preferably likewise absorbent or reflective with respect to the radiation to be detected. Alternatively, the direction-selective element can also be produced as part of a housing of the semiconductor component by means of injection molding or transfer molding methods. In this configuration, a semiconductor component is produced cost-effectively.

In a further configuration, a further radiation-detecting semiconductor chip is applied on the top side of the carrier. Between the detectors and the emitter, a respective barrier is provided on the top side of the carrier. Both detectors detect a radiation. The alteration of the luminance, caused by the object, affects both detectors. Both detector signals can be evaluated by means of a comparison unit. If two detectors and one emitter are situated in the semiconductor component, then a relative movement of an object with respect to the emitting semiconductor chip can be detected. It is thus possible, in a simplified manner, to make statements about whether the object is to the left of, to the right of or directly above the emitting semiconductor chip. If more than two detectors are situated in the semiconductor chip, then two-dimensional locating of the object is possible.

In addition, a further configuration provides for arranging further radiation-emitting semiconductor chips in the semiconductor component. In this case, the emitters are operated in a time division multiplex method, wherein the emitting semiconductor chips are either amplitude-modulated or non-amplitude-modulated. The time division multiplex method is employed in order to communicate to a detector, by means of a time management, which radiation is currently detected. Other methods, such as frequency, code or wavelength division multiplex methods are likewise conceivable. The detector then finds out, by means of a suitable demultiplexing unit, whose radiation of the emitting semiconductor chips is detected.

In order to avoid further interference influences of the radiation, the signal is preferably amplitude-modulated. This modulation is also referred to as "burst-mode" transmission. Further interference influences of the environment are prevented by means of these "bursts" of carrier waves.

By means of the introduction of a multiplicity of detectors and emitters, the resolution of the region to be examined is considerably increased and a more accurate statement about the location of the respective object in a relative position with respect to the radiation-emitting semiconductor chip is possible.

The shaping of the direction-selective element is not limited in this case. By way of example, L-shaped, arcuate or obliquely shaped barriers are provided. In order to improve the sensitivity of the detector, care should always be taken to ensure that the projected areas partly overlap. In other words, it should be endeavored, in principle, to ensure that the detecting semiconductor chip is in the radiation shadow of the emitting semiconductor chip.

In a further configuration, at least one optical element is introduced in the beam path of the emitter and/or of the detector. By this means, improved beam guiding is possible and an increase in sensitivity is obtained.

In one configuration, the detecting semiconductor chip is a phototransistor, a photodiode or a photoresistor.

The emitting semiconductor chip is preferably a laser diode or an LED. In this invention, the wavelength of the radiation to be emitted and to be detected is in no way restricted to a specific range. The radiation to be emitted is preferably in the near infrared wavelength range. Detection of objects is likewise possible in the ultraviolet range or in the visible range of the electromagnetic spectrum.

In accordance with at least one embodiment of the light barrier wherein the latter preferably comprises a plurality of detecting semiconductor chips and/or of radiation-emitting semiconductor chips, the main radiation axes of a predominant proportion or all of the detecting semiconductor chips and/or all of the radiation-emitting semiconductor chips are in each case oriented in a manner tilted relative to one another. In other words, by way of example, no two detecting and/or receiving semiconductor chips have main radiation axes with an identical orientation, in particular relative to the top side of the carrier. In this case, it is possible for a main radiation axis of a detecting semiconductor chip to have the same orientation as a main radiation axis of a radiation-emitting semiconductor chip.

In accordance with at least one embodiment of the light barrier, the radiation-detecting semiconductor chip is an application specific integrated circuit, or ASIC for short.

In accordance with at least one embodiment of the light barrier, the direction-selective element is shaped in a positively locking manner with respect to the detecting semiconductor chip and/or with respect to the radiation-emitting semiconductor chip. In a positively locking manner can mean that the semiconductor chip exhibits a fitting shape with regard to the direction-selective element. By way of example, the semiconductor chip is enclosed by the direction-selective element at least in places at least two boundary areas.

In accordance with at least one embodiment of the light barrier, the direction-selective element is formed by a lens body, wherein the lens body is integrally formed on the semiconductor chip and surrounds the semiconductor chip at least two boundary areas partly or, preferably, completely. In this case, it is possible for the direction-selective element to be fitted directly to the semiconductor chip by means of an injection process or casting process in particular in a manner free of connecting means.

Light barriers described here can be used, for example, for detecting the movement of articles or body parts, in particular for detecting gestures. By way of example, the light barriers described here are used in mobile telephones, in keyboards, in navigation systems, in electronic devices, in computers, in portable computers, in operating panels and/or in the automotive sector particularly as an auxiliary device in the case of control or in the case of data inputting.

Finally, a method for detecting objects is provided, wherein the intensity of the radiation detected in the semiconductor chip is evaluated in an evaluation unit connected downstream, and the distance between the object and the semiconductor component can be deduced on the basis of the magnitude of the intensity. By way of example, a light barrier as described in conjunction with one or more of the embodiments mentioned above can be operated by means of the method. Features of the method are therefore also disclosed for the light barrier, and vice versa.

BRIEF DESCRIPTION OF THE DRAWINGS

Exemplary embodiments of the invention are explained in greater detail below with reference to the figures. Identical or identically acting constituent parts are in each case identified by the same reference symbols. The elements illustrated should not be regarded as true to scale; rather, individual elements may be illustrated with an exaggerated size or with exaggerated simplification, in order to afford a better understanding.

In the figures.

DETAILED DESCRIPTION OF THE DRAWINGS

Figure 1:
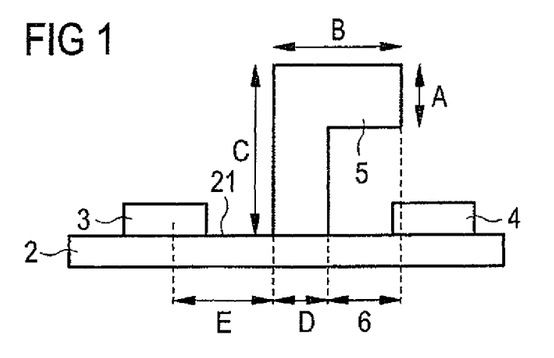
FIG. 1 shows an exemplary embodiment of a light barrier comprising a semiconductor component for detecting objects.

FIG. 1 shows an exemplary embodiment of a light barrier comprising a semiconductor component 1. The semiconductor component 1 has a carrier 2 having a top side 21. A semiconductor chip 3 which emits a radiation is applied on said top side 21. Furthermore, a semiconductor chip 4 which detects a radiation is applied on the top side 21. The detecting semiconductor chip 4 is referred to hereinafter as detector 4. The emitting semiconductor chip 3 is referred to hereinafter as emitter 3.

A direction-selective element, which is fashioned in the form of a barrier 5, is provided between detector 4 and emitter 3 on the top side 21. An angle range of a radiation which can be received by the detector 4 is restricted by the barrier 5. The barrier 5 is shaped in such a way that the detector 4 lies in the radiation shadow of the emitter 3. This is achieved in this case by means of an, as viewed in cross section, L-shape of the barrier 5. If parallel projection perpendicularly is applied to the barrier 5 and the detector 4, then the three-dimensional points of the barrier 5 and of the detector 4 are projected perpendicularly onto a projection plane. If the projection plane is the top side 21 of the carrier, then the projected area of the barrier 5 and that of the detector 4 at least partly overlap. In this case, the illustrated region 6 is depicted as a radiation shadow of the barrier 5, wherein this radiation shadow 6 arises in the case of radiations impinging on the top side perpendicularly and at least partly covers the detector 4.

A main radiation axis U of the radiation emitted by the emitter 3 is symbolized by a dashed line in FIG. 1. The emitted radiation is substantially uninfluenced by the barrier 5 and therefore oriented perpendicularly to the carrier top side 21. By contrast, a main radiation axis V of a radiation which can be received by the detector 4, likewise symbolized by a dashed line, is tilted relative to the main radiation axis U of the emitter 3. The tilting of the main radiation axis U results from the shading by the barrier 5. By way of example, the main radiation axes U, V are defined by a direction in which most of the radiation is emitted or viewed from which an effective detection area of the detector 4 is maximal.

This shaping wherein the projected areas at least partly overlap reduces the crosstalk between emitter 3 and detector 4 and also the environmental influence. Consequently, detectors which detect radiation in the near infrared range, for example, can detect the movement of an object above the semiconductor component 1.

If an object is then situated in the beam path, the radiation of the emitter 3 is at least partly scattered at the surface of the object and sent back in many directions. The scattered radiation is then at least partly detected by the detector 4.

The barrier 5 is applied on the top side 21 by means of adhesive. In this case, the adhesive, in the same way as the barrier 5, is preferably composed of a material which absorbs the radiation to be emitted and/or the radiation to be detected. In the ideal case, the radiation is completely absorbed.

Preferably, in one embodiment, the thickness A of the upper part of the barrier is at most 0.3 mm, the length B of the upper part of the barrier is at most 0.8 mm, the length of the lower part of the barrier is at most 0.8 mm, the radiation shadow 6 of the barrier is at most 0.5 mm, the thickness D of the lower part of the barrier is at most 0.3 mm and the distance E between barrier and emitting semiconductor chip 3 is at most 0.6 mm. Emitter 3 and detector 4 are preferably at a maximum distance from one another of 1.2 mm. The emitter 3 is preferably a Lambertian emitter. The shaping of the barrier 5 in this way prevents crosstalk from the emitter 3 to the detector 4. Ideally, the material of the carrier 2 is likewise absorbent with respect to the radiation to be emitted and/or to be detected. So-called infiltration of the barrier 5 by the radiation generated by the emitter 3 is accordingly prevented.

By way of example, a laser diode or an LED can be provided as emitter 3. By way of example, a phototransistor, a photodiode or a photoresistor can be provided as detector 4.

Figure 2:
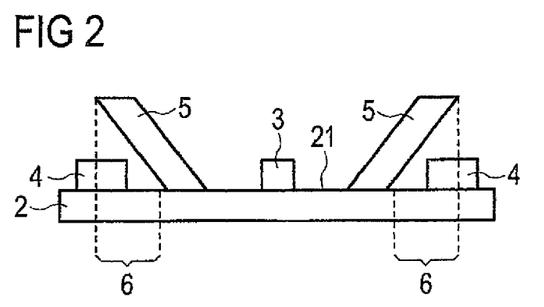
FIG. 2 shows a further exemplary embodiment of a semiconductor component with an alternative design of the barrier.
Figure 3:
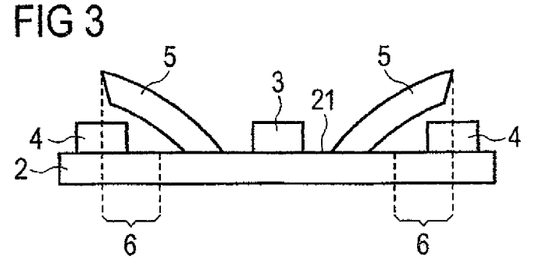
FIG. 3 shows a further exemplary embodiment of a light barrier comprising a semiconductor component with an alternative design of the barrier.
Figure 4:
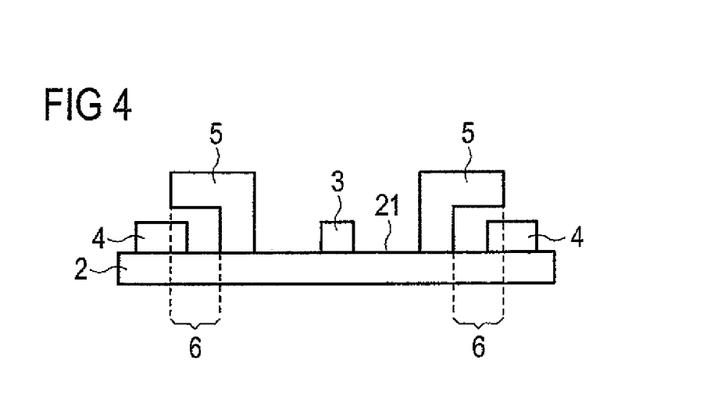
FIG. 4 shows a development of the exemplary embodiment illustrated in FIG. 1.

Further exemplary embodiments of the light barrier are illustrated in FIGS. 2, 3 and 4. In each of FIGS. 2, 3 and 4, a second detector 4 and a further barrier 5 are arranged on the top side 21. In this case, the further barrier 5 is arranged between the further detector 4 and the emitter 3. The shapings of the barrier 5 according to FIGS. 2, 3 and 4 are alternatives to the shaping of the barrier 5 from FIG. 1.

By means of the further detector 4 and the further barrier 5, statements can then be made in a simplified manner about whether an object is in the region to be examined and about the manner of the relative position of the object with respect to the emitter 3. Since both detectors 4 evaluate a luminance signal or radiance signal, it is possible, by evaluating both signals, to determine whether the object is situated to the left of, centrally with respect to, or to the right of, the emitter 3. The value of the luminance can furthermore be used to state the magnitude of the distance F between object and emitter 3.

Figure 8:
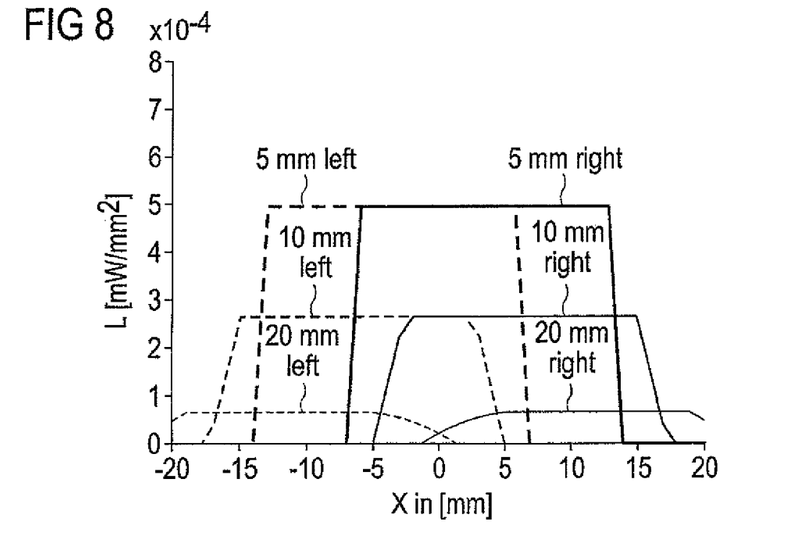
FIG. 8 shows signal profiles of the detected radiance of both detecting semiconductor chips illustrated in FIG. 6.

The signal profile of the received luminance of both detectors 4 in the case of a different distance F between semiconductor component 1 and an object is illustrated in FIG. 8. In FIG. 8, the radiance L in mW per mm$^2$ is represented against a region X in mm. The region X is represented relative to the emitter 3; consequently, the point 0 mm X is the point at which the emitter 3 is situated. A 20 mm×20 mm white paper was used as object in this case. In FIG. 8, a typical input current of approximately 100 mA was used for the emitter 3 and a detector 4 which can detect a photocurrent $I_{photo}$ of the order of magnitude of 10 µA was used.

Said white paper was moved from left to right above the semiconductor component 1. In the first experiment, the distance F was fixed at 5 mm. The dashed lines in each case represent the received signal of the left detector 4, and the solid lines the received signal of the right detector 4. It can clearly be discerned that in the region between −14 mm and −7 mm inclusive only the left detector 4 detects a radiance L, whereas in the region from +7 mm to +14 mm only the right detector 4 detects a radiance L.

If the object is situated in this region, then it is possible to determine very clearly where the object can be found relative to the emitter 3. In the region between −7 mm and +7 mm, given a distance between the object and the semiconductor component 1 of approximately 5 mm, a region is provided in which both detectors 4 detect and it is possible to deduce that the object is in the center above the emitter 3.

It can be discerned that the absolute value of the radiance L is constant over the region from −7 mm to +7 mm given a distance F of 5 mm. Therefore, at small distances F, here for example 5 mm, it can be assumed that a quasi-digital output signal should be expected at the detectors 4. If the distance F is increased, for example 10 mm or 20 mm, the curves are altered, as illustrated in FIG. 8. It is evident that the region to be detected is enlarged, although the received luminance L is reduced.

The information with regard to the two detectors 4 is compared in an evaluation unit (not illustrated) connected downstream of the semiconductor component 1. In this case, by way of example, the ratio of the radiation from the left detector 4 and the right detector 4 is formed. As a result of ratio formation, for example, analog information is obtainable which states the distance F at which the object is situated.

The barrier 5 can be introduced into a semiconductor component 1 by means of injection molding or transfer molding methods. In this case, it is advantageous if the barrier 5 is a part of the lower part of the housing.

Figure 5:
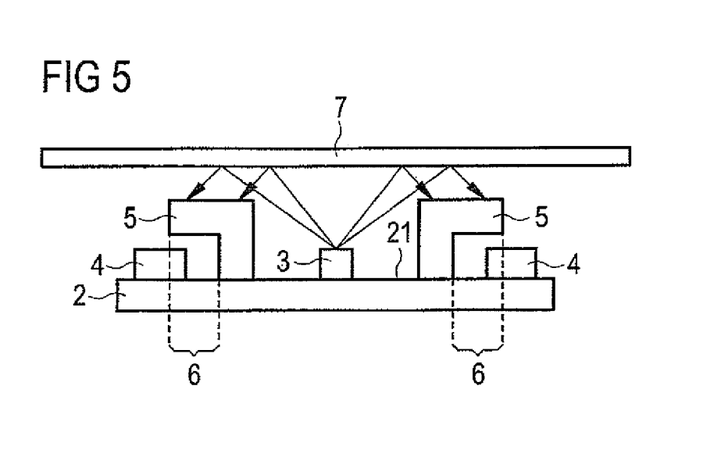
FIG. 5 shows a development of the exemplary embodiment illustrated in FIG. 4.

FIG. 5 illustrates a development of the exemplary embodiment illustrated in FIG. 4. In contrast to FIG. 4, in FIG. 5 a covering 7 is introduced into the beam path of the semiconductor chips 3, 4 above the semiconductor component. In one embodiment, the covering 7 is a glass. Alternatively, the covering 7 is an optical element. Part of the emitted electromagnetic radiation of the emitter 3 is reflected at the surface of the glass covering 7.

By configuring the barrier 5 in the manner already described, there is no longer direct coupling-in from the emitter 3 to the detector 4. Consequently, the crosstalk of emitter 3 and detector 4 is very greatly reduced. As a result, the sensitivity of the detector 4 is greatly increased.

Figure 6:
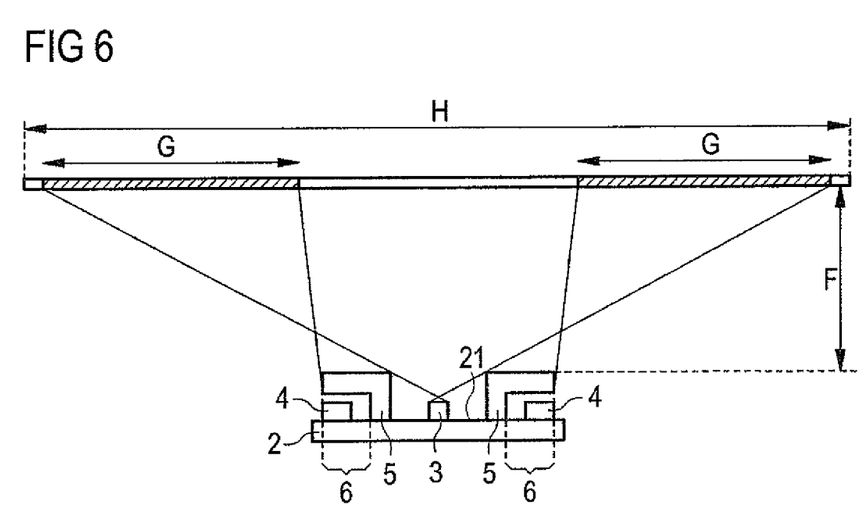
FIG. 6 shows a basic schematic diagram with respect to the detection of objects within the arrangement.

FIG. 6 illustrates a region to be detected. This region is monitored by means of a semiconductor component 1 from FIG. 4. If an object is situated in the region to be examined, then the radiation emitted by the emitter 3 is reflected at the surface of the object. FIG. 6 illustrates, when, the regions G in which the detector 4 is sensitive and the respective left and right detectors 4 receive a radiation to be detected. An expected signal profile of the luminance at the two detectors 4 is qualitatively comparable with the signal profile illustrated in FIG. 8.

Figure 7:
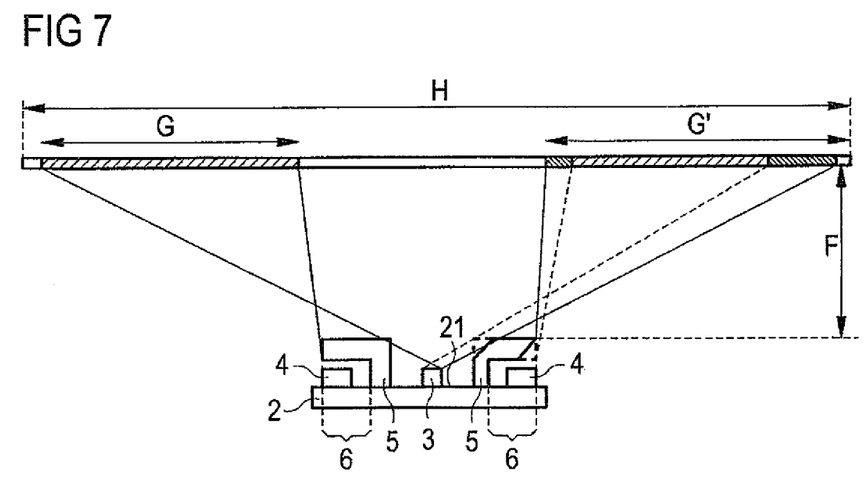
FIG. 7 shows a further basic schematic diagram with a development of the exemplary embodiment illustrated in FIG. 4.

In order to enlarge the sensitive region G, FIG. 7 illustrates a further exemplary embodiment of a barrier 5. It can be discerned that the sensitive region G' arises as a result of the beveling of edges of the upper part of the barrier 5. This region G' is larger in magnitude than the region G for a non-beveled upper part of the barrier 5. This enlargement of the region is significant even though the crosstalk and the environmental influences still remain minimized.

It is also possible for neither of the two detectors 4 to receive a radiation if the object is situated directly above the emitter 3. This region is referred to as the blind region and is situated between the two sensitive zones G.

Figure 9:
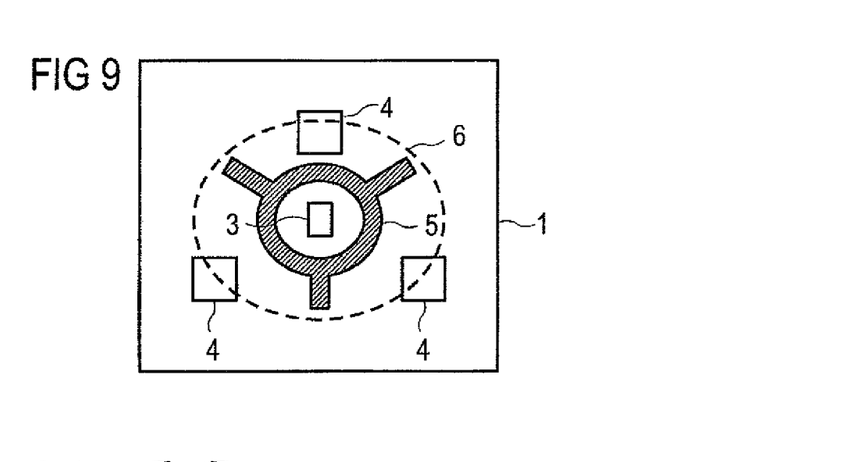
FIG. 9 shows a plan view of a further exemplary embodiment of a light barrier comprising a semiconductor component for detecting objects.

FIG. 9 illustrates a further exemplary embodiment. Here there are three detectors 4 in the semiconductor component, which span a preferably equilateral triangle. The emitter 3 is arranged within the spanned triangle. A ring-shaped barrier 5 is introduced between the emitter 3 and the detectors 4, said barrier being shaped in such a way that it obtains the properties as described with regard to FIG. 1. The resolution of the region to be detected is increased by means of the arrangement according to FIG. 9.

Figure 10:
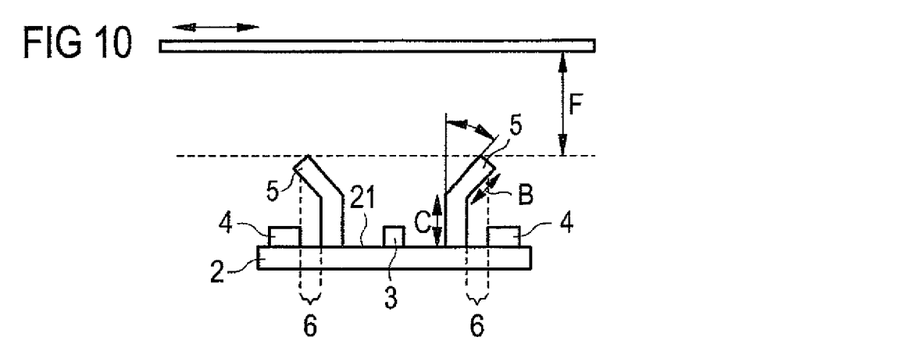
FIG. 10 shows a further exemplary embodiment of a semiconductor component with an alternative design of the barrier.

FIG. 10 illustrates a further exemplary embodiment of a semiconductor component 1. In this case, the upper part of the barrier 5 is not arranged at right angles with respect to the lower part of the barrier 5, but rather is fitted at a specific angle. This configuration, too, in a manner similar to the exemplary embodiment in accordance with FIG. 7, leads to a region enlargement G' without increasing the crosstalk or the influence of the environmental variables.

Figure 11:
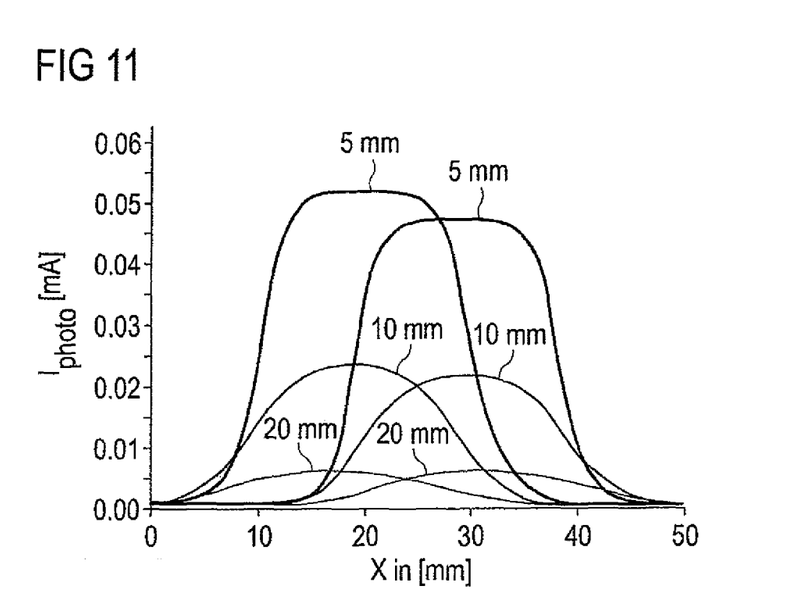
FIG. 11 shows signal profiles of the detected photocurrent of the detecting semiconductor chips illustrated in FIG. 10.
Figure 12:
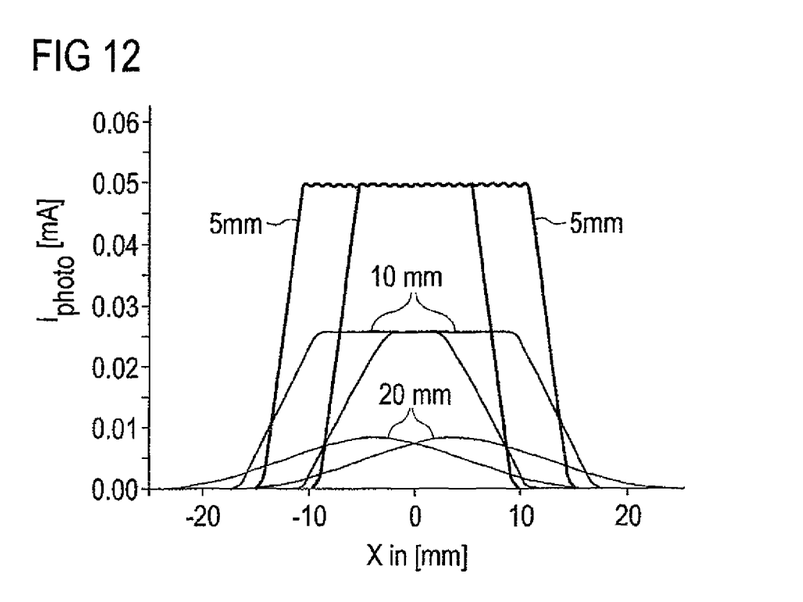
FIG. 12 shows a signal profile of the photocurrent, determined by simulation, of the detecting semiconductor chips illustrated in FIG. 10, and FIGS. 13 to 16 show further exemplary embodiments of the light barrier.

FIGS. 11 and 12 illustrate here the illustrated photocurrent $I_{photo}$ of the left and right detectors A from FIG. 10. In FIG. 11, the photocurrent $I_{photo}$ is obtained by means of measurement, whereas in FIG. 12 it is obtained by means of simulation. In principle, it can be stated that the simulation qualitatively corresponds to the measurement. With regard to the interpretation of the signal profiles, reference is made to FIG. 8, in particular, at this juncture. It should be noted that, by means of the angled barrier 5 from FIG. 10, the region above the emitter 3 is monitored to a greater extent than, for example, with a barrier 5 from FIG. 4.

As illustrated in FIGS. 10, 11, the height or the distance F between the object and the semiconductor component 1 is responsible for how much radiation is still received by the detecting semiconductor chip 4. If the object is further away, from the semiconductor component 1, then a lower luminance L should be expected at the detector 4. By using a third detector, as illustrated in FIG. 9, this two-dimensional recognition is improved. By introducing further detectors 4 and emitters 3, the respective region is resolved in an improved fashion.

The pulses emitted by the emitter 3 are amplitude-modulated in one exemplary embodiment. As a result, these radiation pulses are altered to a lesser extent by environmental influences. In principle, it should be endeavored to transmit the radiation in pulsed form in order to reduce the energy requirement of the semiconductor component 1.

The semiconductor component 1 is provided for use as a light barrier. This semiconductor component 1 can likewise be provided as a proximity sensor or as a fingerprint sensor.

A method for detecting objects by means of a semiconductor component described is furthermore provided, wherein the luminance in the detector 4 is evaluated in an evaluation unit connected downstream and the distance between the object and the semiconductor component 1 is deduced on the basis of the magnitude of the luminance. In this case, the luminance is a measure of the intensity of the radiation determined in the detector 4.

Figure 13:
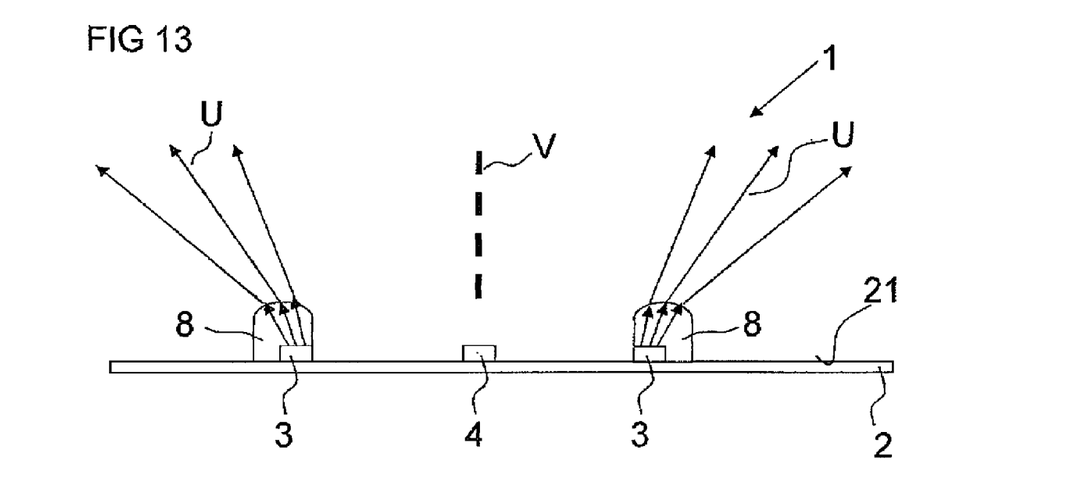

In the exemplary embodiment of the light barrier in accordance with FIG. 13, the direction-selective element 8, which is shaped as a lens body, is fitted above the emitters 3, as viewed from the top side 21. By way of example, the direction-selective element 8 is produced by encapsulating the emitters 3. By means of the direction-selective element 8, radiation generated by the emitter 3, indicated by arrow lines in FIG. 13, is in each case directed in a lateral direction away from the detector 4. A material of the direction-selective element 8, for example a silicone or a thermoplastic, is preferably situated in direct physical contact with a material of the semiconductor chip 3.

It is possible for the emitters 3 to emit radiation having wavelengths that differ from one another, including in combination with wavelength filters at the detector 4. As an alternative or in addition, the emitters 3 can be operated in a multiplex method, in particular in a time division multiplex method.

Figure 14:
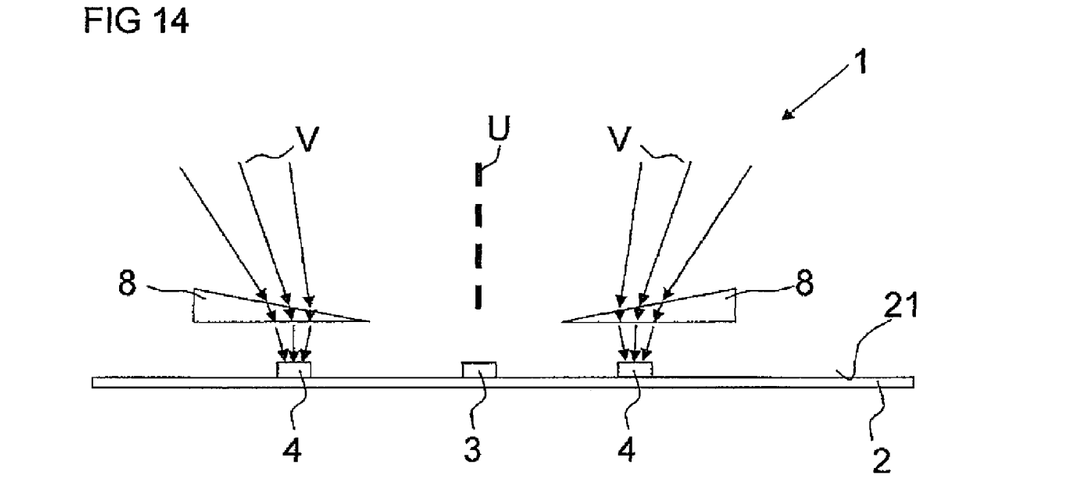

In the exemplary embodiment in accordance with FIG. 14, the direction-selective element 8 is in each case formed by a radiation-transmissive prism disposed downstream of the detectors 4. By virtue of the light-refracting effect of the prism, only radiation generated by the emitter 3 from a specific solid angle range in each case passes to the detectors 4, for instance by means of reflection at an object (not depicted), symbolized by arrow lines in FIG. 14.

A mount (not illustrated) of the direction-selective element 8, by means of which said element is fixed to the carrier 2, can be shaped in each case as a shield situated between the detector 4 and the emitter 3. The mount can then be used to prevent the radiation from passing directly from the emitter 3 to the detector 4 without reflection at an object (not depicted).

Figure 15:
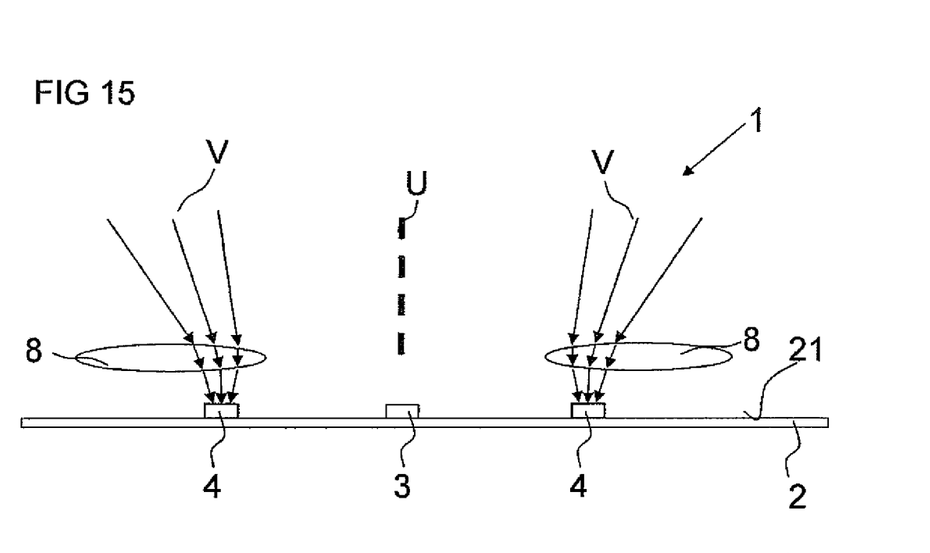

In the exemplary embodiment of the light barrier in accordance with FIG. 15, the direction-selective elements 8 of the semiconductor component 1 are in each case realized by converging lenses, instead of the prisms in accordance with the exemplary embodiment according to FIG. 14. In a departure from the illustration in FIG. 15, the direction-selective element 8 can also be a Fresnel lens instead of a converging lens.

Figure 16:
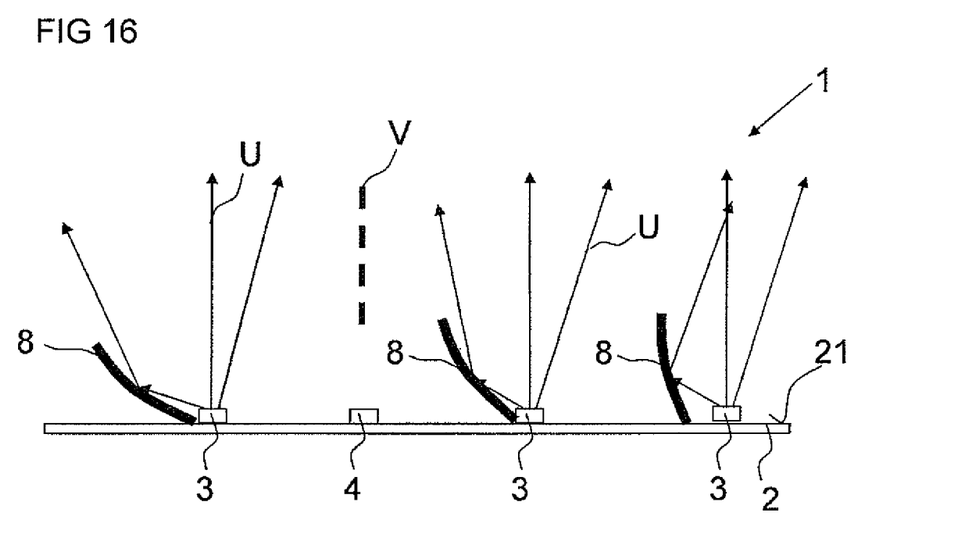

In accordance with FIG. 16, the direction-selective elements 8 are in each case formed by reflectors. In this case, a portion of the reflectors 8 can be situated between the detector 4 and the respective assigned emitter 3. In a departure from the illustration in FIG. 16, it is likewise possible for the reflectors 8 not to differ from one another, but rather to be shaped structurally identically to one another. In this case, the reflectors 8 can be situated in direct contact with the associated emitter 3 or else be spatially separated from the emitter 3. A side of the reflector 8 which is remote from the assigned emitter 3 can be provided with a coating having an absorbent effect for the radiation emitted by the emitters 3, in order to reduce or prevent a stray radiation that can pass to the detector 4. No two of the main radiation axes U, V have the same orientation, relative to the top side 21.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A light barrier comprising a semiconductor component, wherein the semiconductor component comprises:
   a carrier;
   a plurality of semiconductor chips which are applied on a top side of the carrier and which detect an electromagnetic radiation;
   at least one semiconductor chip which emits an electromagnetic radiation and which is fitted to the top side of the carrier; and
   at least one direction-selective element which is fitted to the top side of the carrier and delimits an angle range of the radiation which is receivable by the at least one detecting semiconductor chip of the plurality of emitting semiconductor chips;
   wherein a main radiation axis of the radiation which can be received is tilted relative to a main radiation axis of the radiation to be emitted,
   wherein the at least one direction-selective element is a barrier that consists of a material non-transmissive to the electromagnetic radiation to be detected,
   wherein the barrier is shaped such that, upon parallel projection of the barrier and detecting semiconductor chips of the plurality of semiconductor chips perpendicularly onto the top side of the carrier, a projected area of the barrier and a projected area of each one of the detecting semiconductor chips at least partly overlap, and
   wherein a blind region is provided between sensitive zones of the detecting semiconductor chips, said sensitive zones being regions from which the detecting semiconductor chips can receive radiation and the blind region comprising a region from which none of the detecting semiconductor chips receive radiation when an object is disposed at any location which is directly above the emitting at least one semiconductor chip, along the main radiation axis of the radiation to be emitted.

2. The light barrier as claimed in claim 1, wherein the main radiation axes are tilted relative to one another by between 15° and 45° inclusive.

3. The light barrier as claimed in claim 1, wherein the barrier is spaced apart from the detecting semiconductor chips, and
   wherein the light barrier is shaped such that, upon parallel projection of the light barrier and the detecting semiconductor chips perpendicularly onto the top side of the carrier, a projected area of the light barrier and a projected area of the detecting semiconductor chips at least partly overlap.

4. The light barrier as claimed in claim 3, wherein the light barrier is situated between the emitting at least one semiconductor chip and the detecting semiconductor chips.

5. The light barrier as claimed in claim 1, wherein the at least one direction-selective element is fitted onto the top side of the carrier by an adhesive.

6. The light barrier as claimed in claim 1, wherein main radiation axes of the detecting semiconductor chips are oriented parallel to one another, or wherein the main radiation axis of the emitting at least one semiconductor chip is an axis of symmetry with respect to a main radiation axes of the detecting semiconductor chips.

7. The light barrier as claimed in claim 1, wherein a plurality of radiation-emitting semiconductor chips are arranged on the top side of the carrier and the emitting at least one semiconductor chip of the plurality of radiation-emitting semiconductor chips emits amplitude-modulated or non-amplitude-modulated radiation pulses in a time division multiplex method.

8. The light barrier as claimed in claim 3, wherein the barrier is at least one of L-shaped, arcuate and obliquely shaped.

9. The light barrier as claimed in claim 1, wherein at least one optical element for improved beam guiding is arranged above at least one semiconductor chip of the plurality of semiconductor chips in the beam path of a respective semiconductor chip.

10. The light barrier as claimed in claim 1, wherein at least one detecting semiconductor chip of the detecting semiconductor chips is one of an application specific integrated circuit, a phototransistor, a photodiode and a photoresistor.

11. The light barrier as claimed in claim 1, wherein the at least one emitting semiconductor chip is a laser diode or a light emitting diode (LED).

12. The light barrier as claimed in claim 1, wherein the at least one direction-selective element is shaped in a positively locking manner with respect to at least one detecting semiconductor chip of the detecting semiconductor chips and the emitting at least one semiconductor chip.

13. A method for detecting objects by the light barrier as claimed in claim 1, wherein an intensity of the radiation detected in the at least one detecting semiconductor chip is evaluated in an evaluation unit connected downstream and a distance between an object and the semiconductor component is deduced based on a magnitude of the intensity;
   wherein intensities of at least two detecting semiconductor chips are evaluated in the evaluation unit; and
   wherein a relative position of the object with respect to the at least one emitting semiconductor chip is determined based on intensities of the detected radiation.

14. The method as claimed in claim 13, wherein a resolution for detecting the object is increased by using at least one of further emitting semiconductor chips and detecting semiconductor chips; and wherein a sensitivity for detecting objects is increased by using optical elements in a beam path of the plurality of semiconductor chips.

15. A light barrier comprising a semiconductor component, wherein the semiconductor component comprises:
   a carrier;
   at least three semiconductor chips which are applied on a top side of the carrier and which detect an electromagnetic radiation;
   at least one semiconductor chip which emits an electromagnetic radiation and which is fitted to the top side of the carrier; and
   at least one direction-selective element which is fitted to the top side of the carrier and delimits an angle range of the radiation which is receivable by a detecting semiconductor chip of the at least three semiconductor chips;
   wherein a main radiation axis of the radiation which can be received is tilted relative to a main radiation axis of the radiation to be emitted;
   wherein the at least one direction-selective element is a barrier situated between each emitting semiconductor chip of the plurality of semiconductor chips and the detecting at least three semiconductor chips, respectively;
   wherein a blind region is provided between sensitive zones of the detecting at least three semiconductor chips, said sensitive zones being regions from which the detecting semiconductor chips can receive radiation and the blind region comprising a region from which none of the detecting semiconductor chips receive radiation when an object is disposed at any location which is directly above the emitting at least one semiconductor chip along the main radiation axis of the radiation to be emitted;
wherein the at least three detectors enable two-dimensional locating of the object.

16. The light barrier as claimed in claim 1, wherein the emitting at least one semiconductor chip emits radiation of different wavelengths.

17. The light barrier as claimed in claim 15, wherein the top side of the carrier is a plane surface and the barrier completely covers the plurality of semiconductor chips which emit the electromagnetic radiation when seen in top view onto the top side, wherein the barrier is formed to be asymmetric when seen in a cross-sectional view, wherein a plurality of light barriers are provided, a number of light barriers being equal to a number of detecting chips, and the light barriers and detecting chips being arranged in a one-to-one manner, and wherein each of the plurality of barriers completely covers an assigned detecting chip when seen from the top view.

18. The light barrier as claimed in claim 1, wherein the sensitive zones do not overlap.

* * * * *